(12) United States Patent
Bengtsson

(10) Patent No.: US 12,372,560 B2
(45) Date of Patent: Jul. 29, 2025

(54) PROVIDING A FREQUENCY OF AN ELECTRICAL QUANTITY IN AN ELECTRICAL POWER SYSTEM

(71) Applicant: Hitachi Energy Ltd, Zürich (CH)

(72) Inventor: Tord Bengtsson, Västerås (SE)

(73) Assignee: HITACHI ENERGY LTD, Zurich (CH)

( * ) Notice: Subject to any disclaimer, the term of this patent is extended or adjusted under 35 U.S.C. 154(b) by 163 days.

(21) Appl. No.: 18/020,589

(22) PCT Filed: Aug. 31, 2021

(86) PCT No.: PCT/EP2021/074063
§ 371 (c)(1),
(2) Date: Feb. 9, 2023

(87) PCT Pub. No.: WO2022/049092
PCT Pub. Date: Mar. 10, 2022

(65) Prior Publication Data
US 2023/0314492 A1    Oct. 5, 2023

(30) Foreign Application Priority Data

Sep. 1, 2020 (EP) .................................. 20193795

(51) Int. Cl.
*G01R 23/06* (2006.01)
*G01R 19/25* (2006.01)
*G01R 23/18* (2006.01)

(52) U.S. Cl.
CPC .......... *G01R 23/06* (2013.01); *G01R 19/2513* (2013.01); *G01R 23/18* (2013.01)

(58) Field of Classification Search
CPC .... G01R 19/25; G01R 19/2513; G01R 23/02; G01R 23/06; G01R 23/16; G01R 23/18; H02J 3/241
See application file for complete search history.

(56) References Cited

U.S. PATENT DOCUMENTS 5,832,414 A    11/1998  Hart et al.
6,489,923 B1 * 12/2002  Bevan ..................... G01S 3/023
                                                    342/378
(Continued)

FOREIGN PATENT DOCUMENTS

CN      102680785 A    9/2012
JP      H5-223860 A    9/1993
(Continued)

OTHER PUBLICATIONS

Ghafari et al., "Phasors Estimation at Offnominal Frequencies Through an Enhanced-SVA Method With a Fixed Sampling Clock", IEEE Transactions on Power Delivery vol. 32, No. 4, Aug. 2017, pp. 1766-1775.

(Continued)

*Primary Examiner* — Huy Q Phan
*Assistant Examiner* — David B Frederiksen
(74) *Attorney, Agent, or Firm* — Procopio, Cory, Hargreaves & Savitch LLP

(57) ABSTRACT

A method for providing a frequency of an electrical quantity in an electrical power system comprises obtaining, with respect to a first time, a first discrete Fourier transform (DFT) phasor of an electrical quantity in the electrical power system, estimating a second DFT phasor at a time interval before the first time, where the time interval depends on an approximated frequency, and determining the frequency at the first time based on the first and the second DFT phasor.

20 Claims, 4 Drawing Sheets

(56) References Cited

U.S. PATENT DOCUMENTS

| | | |
|---|---|---|
| 7,328,114 B2 | 2/2008 | Premerlani et al. |
| 2004/0186670 A1* | 9/2004 | Hart .................... H02J 13/0004 |
| | | 702/57 |
| 2007/0136013 A1* | 6/2007 | Premerlani ............ G01R 29/18 |
| | | 702/75 |
| 2013/0173189 A1 | 7/2013 | Zhang et al. |
| 2014/0330443 A1 | 11/2014 | Mai et al. |
| 2016/0154041 A1 | 6/2016 | Bi et al. |
| 2017/0219640 A1 | 8/2017 | Ha et al. |
| 2017/0254840 A1 | 9/2017 | Xing |
| 2018/0059154 A1* | 3/2018 | Mecreant ............. G01R 23/005 |
| 2018/0321290 A1 | 11/2018 | Abeywickrama et al. |
| 2018/0348266 A1* | 12/2018 | Yao .................... G01R 19/2513 |
| 2019/0006847 A1* | 1/2019 | Venkatasubramanian ................... |
| | | H02J 13/00002 |

FOREIGN PATENT DOCUMENTS

| | | |
|---|---|---|
| JP | 2004-29032 A | 1/2004 |
| JP | 2013-53861 A | 3/2013 |
| JP | 2014-121252 A | 6/2014 |
| WO | 2018/224866 A1 | 12/2018 |

OTHER PUBLICATIONS

Maharjan et al., "Improved Off-Nominal Operation of Phasor Measurement Units using Discrete Fourier Transformation", 2015, IEEE, 978-1-4799-7949-3/15, 5 pages.

* cited by examiner

US 12,372,560 B2

PROVIDING A FREQUENCY OF AN ELECTRICAL QUANTITY IN AN ELECTRICAL POWER SYSTEM

CROSS-REFERENCE TO RELATED APPLICATIONS

The present application is a national-stage entry of International Patent App. No. PCT/EP2021/074063, filed on Aug. 31, 2021, which claims priority to European Patent App. No. 20193795.0, filed on Sep. 1, 2020, which are both hereby incorporated herein by reference as if set forth in full.

FIELD OF INVENTION

The invention relates to a method and computer program product for providing a frequency of an electrical quantity in an electrical power system as well as to a phasor processing device for use in such an electrical power system.

BACKGROUND

Phasors of electrical physical quantities are important in the protection of equipment in power systems. A lot of activities such as protective activities are based on phasor measurements.

Moreover, the frequency of a power system is also important to know in several situations by its own. A power system typically has a nominal frequency. Due to various situations such as faults and load variations, the frequency may vary from the nominal. Furthermore, due to the emergence of renewable energy sources the frequency stability of the power system can be low. Thereby the system frequency can change rapidly, which at times can be detrimental and have to be handled. In order to correctly handle such situations, the momentaneous system frequency therefore needs to be accurately determined.

Furthermore, the amplitude and phase of the voltage and current are important in many situations, for instance in order to determine if there is a fault on a power line. The phasors are obtained using so-called discrete Fourier transform (DFT) and reflect the nominal frequency, amplitude and phase. The accuracy of the DFT phasor is therefore also important.

An example of prior art may be found in U.S. Pat. No. 5,832,414 relating to a generator protection system and a method of compensating for errors in phasor estimation due to oscillations in discrete Fourier transform.

Aspects of the invention address one or more of the above-mentioned situations.

SUMMARY OF THE INVENTION

One object of embodiments of the present invention is to apply a fault handling measure based on an improved estimation of a power system frequency.

This object is according to a first aspect achieved through a method for providing a frequency of an electrical quantity in an electrical power system. The method comprises:
  obtaining, with respect to a first time at which the electrical quantity is sampled, a first discrete Fourier transform, DFT, phasor of an electrical quantity in the electrical power system,
  estimating a second DFT phasor at a first time interval before the first time, said first time interval depending on an approximated frequency, wherein the second DFT phasor is estimated by interpolation using DFT phasors obtained at sampling times around the time at which the second DFT phasor is to be estimated, and determining the frequency at the first time based on the first and the second DFT phasor.

The object is according to a second aspect achieved through a phasor processing device for use in an electrical power system. The phasor processing device is configured to:
  obtain, with respect to a first time, a first discrete Fourier transform, DFT, phasor of an electrical quantity in the electrical power system,
  estimate a second DFT phasor at a first time interval before the first time, said first time interval depending on an approximated frequency, wherein the second DFT phasor is estimated by interpolation using DFT phasors obtained at sampling times around the time at which the second DFT phasor is to be estimated, and
  determine the frequency at the first time based on the first and the second DFT phasor.

The phasor processing device may comprise a processor that is configured to perform the previous mentioned activities.

The phasor processing device may as an example be an intelligent electronic device, such as a protection relay. As another example it may be a phasor measurement unit, a grid controller or a merging unit. The phasor processing device may thus be selected from the group consisting of intelligent electronic device, protection relay, phasor measurement unit, grid controller and merging unit.

The above-mentioned object is according to a third aspect achieved through a computer program product for providing a frequency of an electrical quantity in an electrical power system, where the computer program product is provided on a data carrier comprising computer program code configured to cause a processor to, when the computer program code is being operated upon by the processor
  obtain, with respect to a first time, a first discrete Fourier transform, DFT, phasor of an electrical quantity in the electrical power system,
  estimate a second DFT phasor at a first time interval before the first time, said first time interval depending on an approximated frequency, wherein the second DFT phasor is estimated by interpolation using DFT phasors obtained at sampling times around the time at which the second DFT phasor is to be estimated, and
  determine the frequency at the first time based on the first and the second DFT phasor.

By the expression "at sampling times around the time at which the second DFT phasor is to be estimated" it is meant, for example, a plurality of sampling times, wherein a sampling time of the plurality of sampling times are preceding or following the time at which the second DFT phasor is to be estimated. Interpolation requires samples which are preceding, i.e. before, the desired time and samples which are following, i.e. after, the desired time. Interpolation may use the same number of samples which are preceding the desired time as samples which are following the desired time. However, interpolation may use different numbers of samples which are preceding the desired time as compared to samples which are following the desired time. For example, or one or more sampling times may be preceding, and the remaining sampling time(s) may be following, the time at which the second DFT phasor is to be estimated.

A DFT phasor of the DFT phasors may be obtained at a sampling time preceding the time at which the second DFT phasor is to be estimated and another DFT phasor of the DFT phasors may be obtained at a sampling time following the time at which the second DFT phasor is to be estimated.

According to the first, second and third aspects, the second DFT phasor may be estimated by linear interpolation using a DFT phasor obtained at a sampling time directly preceding the time at which the second DFT phasor is to be estimated and another DFT phasor obtained at a sampling time directly following the time at which the second DFT phasor is to be estimated.

Alternatively, according to the first, second and third aspects, the second DFT phasor may be estimated by higher order interpolation using at least three DFT phasors obtained at samplings times around the time at which the second DFT phasor is to be estimated.

A DFT phasor of the at least three DFT phasors may be obtained at a sampling time preceding the time at which the second DFT phasor is to be estimated, and another phasor of the least three DFT phasors may be obtained at a sampling time following the time at which the second DFT phasor is to be estimated. At least one DFT phasor of the at least three DFT phasors may be directly preceding or following the time at which the second DFT phasor is to be estimated.

According to a first variation of the first and second aspects, the approximated frequency used in the estimation of the second DFT phasor is a frequency at a second time preceding to the first time, in particular the frequency at the second time is determined based on a previous DFT phasor at the second time and a previous estimated DFT phasor at a second time interval before the second time. It is additionally possible that a first used approximated frequency is a nominal frequency of the electrical power system.

According to a second variation of the first and second aspects, the time interval is given by one divided by a product, where the product is two times the approximated frequency, where the approximated frequency is the frequency used in the estimation of the second phasor. It is thus the frequency on which the first time interval depends.

The first and the second times may additionally be sampling times, i.e. times at which the phasors are sampled. However, the first time interval before the first time and the second time interval before the second time may be points in time between sampling times.

According to a third variation of the first aspect, the determining of the frequency based on the first and the second DFT phasor comprises determining a difference in phase angle between the first and the second DFT phasor.

According to a corresponding variation of the second aspect, the phasor processing device is configured to determine a difference in phase angle between the first and the second DFT phasor when determining the frequency based on the first and the second DFT phasor.

A fifth aspect is concerned with a method for improving phasor accuracy of an electrical quantity in an electrical power system, which method comprises obtaining a phasor of the electrical quantity, in particular the first DFT phasor according to the first aspect,
   obtaining a frequency of the electrical quantity, in particular according to the method of the first aspect,
   applying the frequency to a correction function, which correction function is based on an analytical expression for the phasor, and
   adjusting the phasor with a correction factor obtained from the correction function.

In addition, the above described fifth aspect and the following variations of the fifth aspect may be provided as an additional variation of the first, second and third aspects.

In other words, the fifth aspect may be combined with the first, second and third aspects.

In a variation of the second aspect corresponding to the fifth aspect, the phasor processing device is further configured to apply the determined frequency to a correction function, which correction function is based on an analytical expression for the first DFT phasor, and
   adjust the first phasor with a correction factor obtained from the correction function.

According to a variation of the second and fifth aspects, the analytical expression is based on a sinusoidal function. The sinusoidal function may additionally be a sinusoidal function with fixed amplitude.

The correction function may comprise a phase of the phasor as a parameter.

According to a further variation of the fifth aspect, the method further comprises estimating the phase for the correction function based on the phasor.

According to a corresponding variation of the second aspect the phasor processing device is further configured to estimate the phase for the correction function based on the phasor.

According to another variation of the fifth aspect, the method further comprises estimating an initial phase to be used in the correction function based on the analytical expression and a zero phase angle.

According to a corresponding variation of the second aspect the phasor processing device is further configured to estimate an initial phase to be used in the correction function based on the analytical expression and a zero phase angle.

The initial phase may be estimated based on a difference between the phase of the DFT phasor at the first time and a phase of the correction function with a phase angle parameter setting of zero. Alternatively, the initial phase may be estimated through applying a zero phase angle in an analytical expression that is a series expansion of the analytical expression for the phasor around a nominal frequency of the power system.

It is additionally possible that the determined frequency at the first time and/or the adjusted phasor is applied in a fault handling measure in the electrical power system.

The fault handling measure may be a Rate of Change of Frequency (ROCOF) protection measure and/or a generator protection measure. A non-limiting example of a possible fault is a short circuit fault.

The present invention has a number of advantages. It provides an improved accuracy of the frequency determination as well as of the phasor estimation. Thereby it may additionally ensure reliability of phasor estimates under severe system contingencies, such as when the frequency deviates considerably from nominal.

BRIEF DESCRIPTION OF THE DRAWINGS

The present invention will in the following be described with reference being made to the accompanying drawings, where FIG. 1 schematically shows an electrical power system comprising a power line connected to a phasor processing device, FIG. 2 schematically shows one realization of the phasor processing device, which device comprises a DFT phasor determining module, a frequency estimating module, a DFT phasor correcting module and a protective action performing module, FIG. 3 schematically shows an alternative realization of the phasor processing device.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

The present invention generally concerns the provision of a frequency and/or a phasor of an electrical quantity in an electrical power system, such as an Alternating Current (AC) power system, which frequency and/or can be used for performing of fault handling measures in the electrical power system.

Figure 1:
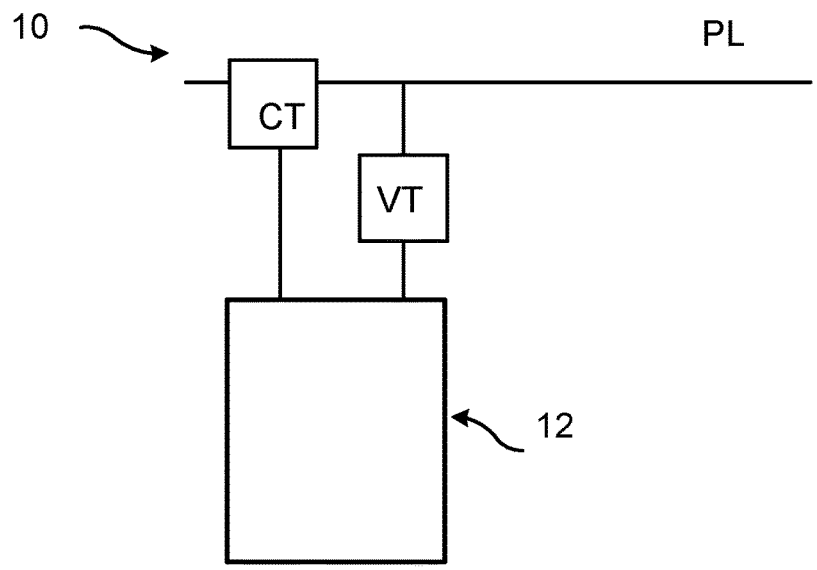

FIG. 1 schematically shows a power line PL in a such an electrical power system 10. To the power line PL there is connected a phasor processing device 12, i.e. a device that processes phasors. The processing may involve determining of a frequency based on phasors of an electrical quantity in the electrical power system. The phasor processing device 12 may therefore also be considered as a device that provides a frequency of an electrical quantity in the electrical power system. The phasor processing device 12 may with advantage be an Intelligent Electronic Device (IED) such as a protection relay.

The phasor processing device 12 is in this example implemented as a protection relay connected to the power line PL via a current transformer CT and a voltage transformer VT. The protection relay measures the current and voltage of the power line PL at discrete points in time or time instances, often denoted sampling times.

Figure 2:
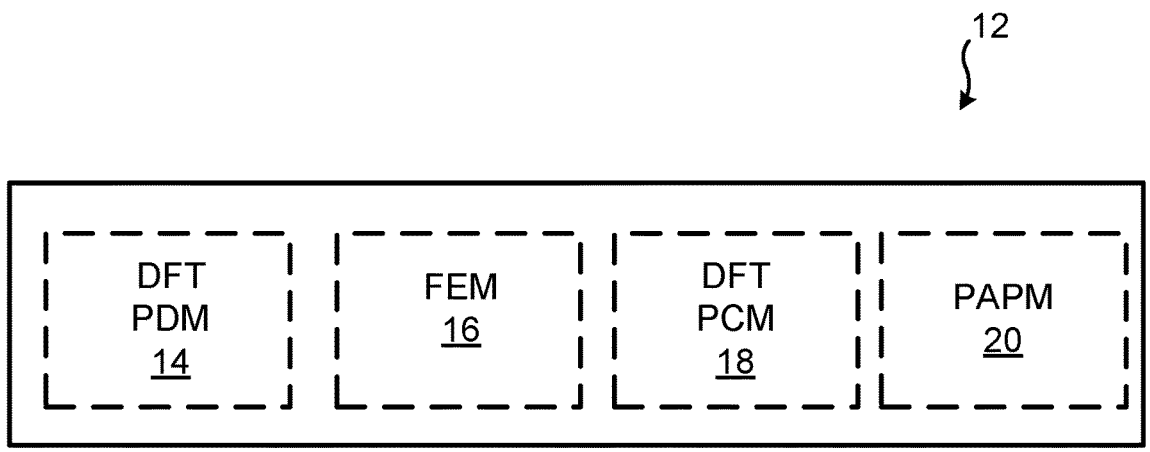

FIG. 2 schematically shows one realization of the phasor processing device 10. The phasor processing device comprises a Discrete Fourier Transform (DFT) phasor determining module DFT PDM 14, a frequency estimating module FEM 16, a DFT phasor correcting module DFT PCM 18 and a protective application performing module PAPM 20. The protective application performing module 20 may be connected to a further device that performs the protective application. In the case of a protection relay it may as an example be connected to a circuit breaker. As was mentioned above, the phasor processing device 12 may have other realizations, such as in the form of a phasor measurement unit (PMU), a grid controller or a merging unit and in this and other cases it may be connected to other devices such as to a converter or to a Static VAR Compensator. Such an activity performing device may also be a part of the phasor processing device 12.

It is additionally possible that the DFT phasor determining module 14 is provided as a separate device that supplies DFT phasors to the phasor processing device 12 for processing the phasor. It is additionally possible that the DFT phasor correcting module 18 is omitted.

The DFT phasor determining module 14, the frequency estimating module 16, the DFT phasor correcting module 18 and the protective application performing module 20 may be realized as one or more dedicated integrated circuits such as Application-Specific Integrated Circuits (ASICs) or Field-Programmable Gate Arrays (FPGAs).

Figure 3:
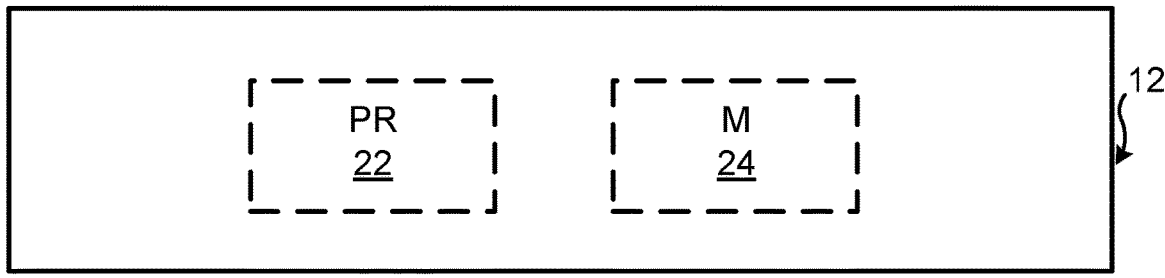

As an alternative the DFT phasor determining module 14, the frequency estimating module 16, the DFT phasor correcting module 18 and the protective application performing module 20 may be realized as one or more processors acting on computer program instructions in one or more computer memories implementing the module functionality. FIG. 3 shows one such realization of the modules in the phasor processing device 12 where there is a processor PR 22 and a memory 24 and the processor 22 acts on computer instructions in the memory 24 implementing the modules.

The DFT phasor determining module 14 determines DFT phasors of one or more of the electrical quantities current and voltage being measured by the current and voltage transformer CT and VT. As is known in the art a phasor is realized as the amplitude and phase of such a quantity and may be calculated as a DFT phasor.

A power system typically has a nominal frequency such as 50 or 60 Hz. However, the system is typically not able to keep the nominal system frequency. The system frequency can vary around the nominal frequency, where such frequency variations as an example may be influenced by load variations. Moreover, power generation systems are more and more employing renewable power sources with low inertia as compared with for instance synchronous machines. Thereby the system frequency may become instable and volatile.

It is therefore of interest to obtain precise estimations of the momentaneous system frequency. Aspects of the invention are directed towards providing good estimations of the momentaneous system frequency.

One frequently used quantity in power systems is the phasor, i.e. the amplitude and phase of an electrical quantity. The phasor is important in a number of different activities. It is therefore often at hand and is therefore also a good source for determining the system frequency. The phasor is furthermore often calculated as a DFT phasor based on measurement samples of an electrical quantity.

The DFT can be obtained based on a stream of samples of amplitude measurements taken at a sampling time as:

$$DFT(A_k) = \frac{2}{N}\sum_{i=0}^{N-1} A_{k-i} e^{2\pi j i/N} \tag{1}$$

where the sample stream Ak is amplitude measurements taken at a constant sampling time interval $t_s$ and the DFT of sample k is thus the average of the last N samples weighted with the complex exponential $e^{2\pi j\ i/N}$, where j is the imaginary unit.

If the DFT of a phasor is investigated in a Mathematical Analysis Tool, such as Mathematica, it is possible to obtain a first analytical DFT phasor expression of the Analysis Tool that can be analyzed, which analytical expression is based on a sinusoidal function, in particular with fixed frequency.

In for instance Mathematica, the following equation of the analysis tool is obtained as the first analytical expression if the DFT of a sinusoidal wave of frequency f and phase angle φ is desired $$DFT[\sin(2\pi ft + \varphi)] = \frac{2}{N}\sum_{k=0}^{N-1}\sin(2\pi fkt_s + \varphi)e^{-2\pi jf_0kt_s} == \quad (2)$$

$$\frac{je^{-j\left(-\frac{2\pi}{N}+\varphi+\frac{2f\pi}{f_0}\right)}\left(-1+e^{\frac{2jf\pi}{f_0}}\right)\left(e^{\frac{2j\left(\pi+\frac{f\pi}{f_0}\right)}{N}}-e^{2j\left(\varphi+\frac{f\pi}{f_0}\right)}+e^{\frac{2j\left(\pi+N\varphi+\frac{f\pi}{f_0}+\frac{fN\pi}{f_0}\right)}{N}}-e^{\frac{4jf\pi}{Nf_0}}\right)}{\left(-1+e^{\frac{2j\left(\pi+\frac{f\pi}{f_0}\right)}{N}}\right)\left(e^{\frac{2j\pi}{N}}-e^{\frac{2jf\pi}{Nf_0}}\right)N}$$

where $f_o$ is the nominal system frequency, k is the summation index and N is the number of samples summed for $N=1/(f_o\ t_s)$, i.e. one full nominal period.

When studying equation (2), which is the first analytical expression of the Analytics tool, the inventor made a few observations. A first observation is that the equation is a closed expression containing no sums. Thus, the computational cost is the same whatever the value of N. The computational cost can however anyhow be considerable as it contains a number of complex exponentials; there appear to be 9 such but a closer study reveals that these can be reduced to combinations of 4 basic complex exponentials.

Figure 4:
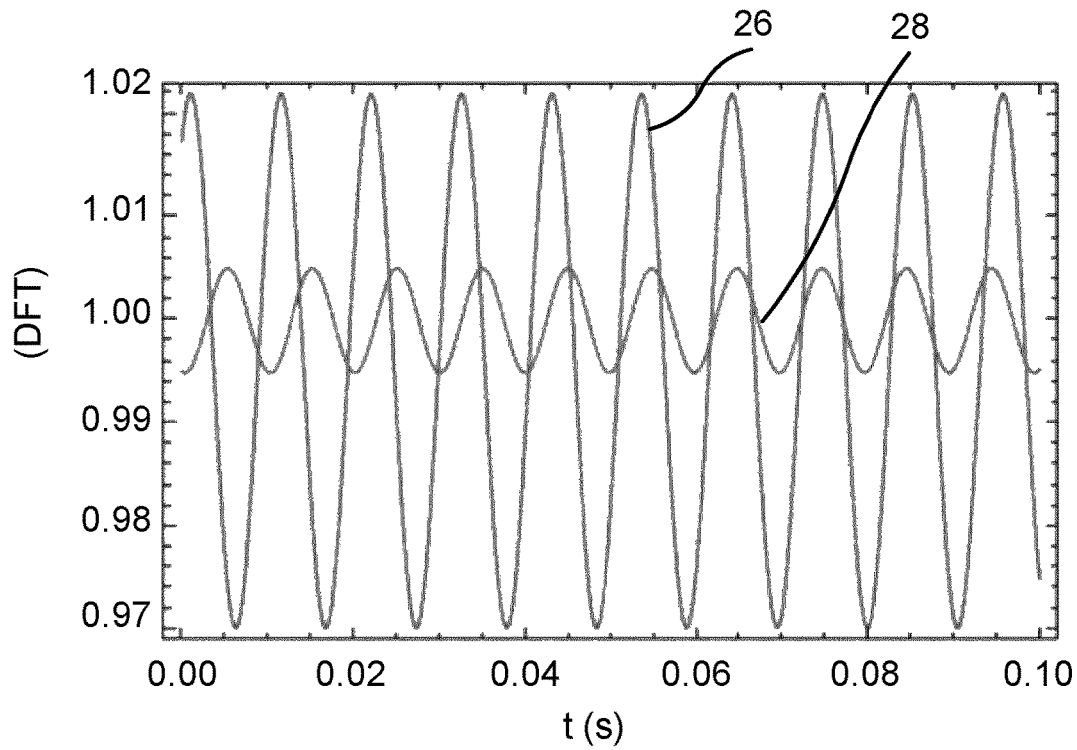
FIG. 4 shows the time dependencies of amplitude of two phasors with frequencies that deviate from a nominal frequency.

A second observation made by the inventor can be understood from FIG. 4 which shows the time dependence of the amplitude 26 of a DFT phasor with a frequency deviation that is $0.95*f_o$ and the time dependence of the amplitude 28 of a DFT phasor with a frequency deviation that is $1.01*f_o$. It can be seen that twice the actual frequency seems to play a role in the determination of the phasor. A third observation made by the inventor is that the initial phase angle, φ, plays the role of time.

$$\varphi = 2\pi ft \quad (3)$$

The time t occurring in eq. 2 is limited to the summation range t=0 to $t_s(N-1)$ and the initial angle reflects the delay between consecutive DFT calculations for every new sample.

The ideal case $f=f_o$ is of cause covered by eq. 2 but requires that a limiting value is taken as both the numerator and denominator are zero in this case. The result has some interest:

$$\lim_{f\to f_0} DFT[\sin(2\pi ft + \varphi)] = -je^{j\varphi} \quad (4)$$

This means that in this case the amplitude is 1 and the DFT angle increases linearly with time, being offset π/2.

Figure 5:
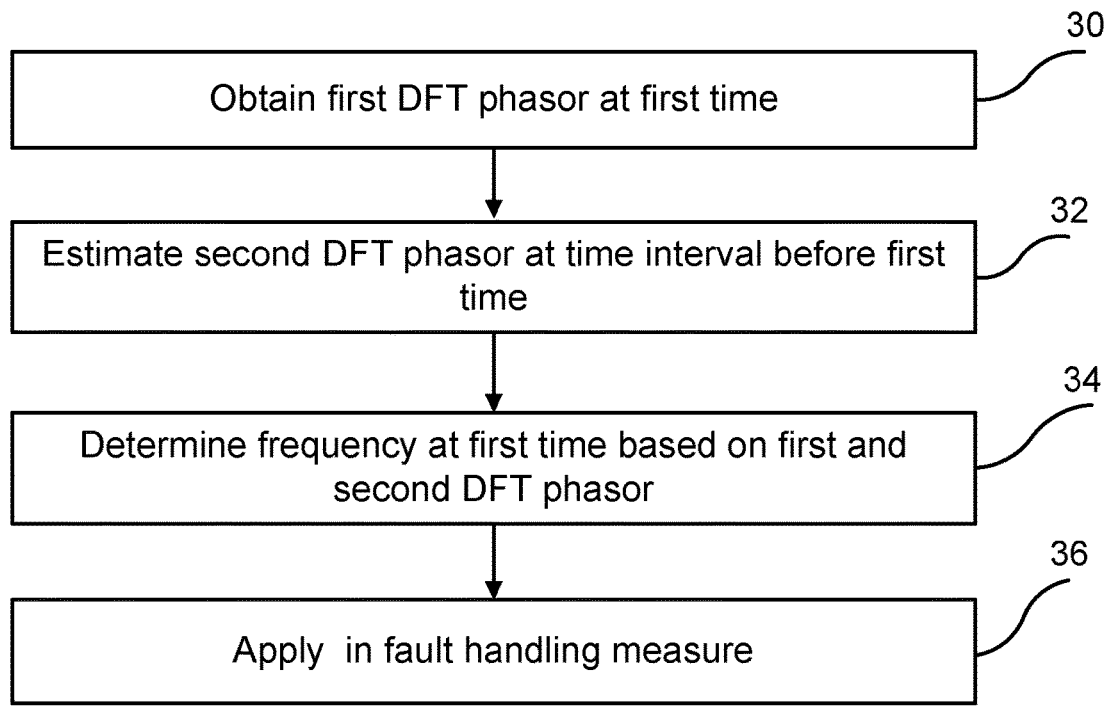
FIG. 5 shows a number of elements in a method for providing a frequency of an electrical quantity in the electrical power system.

How this knowledge can be employed will now be described in more detail with reference being made to FIG. 5, which shows a flow chart of a number of elements in a method for providing a frequency of an electrical quality in an electrical power system.

The DFT phasor determining module 14 continuously determines DTF phasors, for instance phasors of electrical quantities in the form of currents and/or voltages measured by the current transformer CT and the voltage transformer VT. These DFT phasors are also supplied to the frequency estimation module FEM 16. The frequency estimation module 16 then determines the frequency of the phasor.

For a DFT phasor, the frequency estimation module 16 has the following operation;

The frequency estimation module 16 obtains a first DFT phasor with respect to a first time from the DFT phasor determining module 14, 30, where the first time may be a current point in time that may additionally be a time at which the electrical quantity is measured or sampled. The frequency estimation module 16 then proceeds and estimates a second DFT phasor at a first time interval before the first time, 32, which first time interval depends on an approximated frequency. The first time interval may more particularly be given by one divided by a product, where the product is two times the approximated frequency.

The approximated frequency may more particularly be a frequency at a second time preceding the first time. The second time may for instance be the time of a preceding sample, i.e. a sample of the physical quantity that precedes the current sample of the physical quantity.

Thereafter the frequency estimating module 16 determines the frequency at the first time based on the first and the second DFT phasor, 34. The determining of the frequency may comprise determining a difference in phase angle between the first and the second DFT phasor.

The frequency at the second time that is used as an approximated frequency may have been determined in the same manner as the frequency at the first time, i.e. based on a third DFT phasor at the second time and a previous estimated fourth DFT phasor at a second time interval before the second time, where the second time interval in this case depends on a further approximated frequency at a third time preceding the second time. The initial approximated frequency can furthermore be the nominal frequency.

The frequency f may more particularly be obtained according to:

$$f = \frac{1}{2\pi}\frac{d}{dt}\text{Phase}[DFT(A_k)] \quad (5)$$

i.e. as a time derivative of the phase angle of the phasor $A_n$. It can thereby be understood that the determining of the frequency at the first time based on the first and the second DFT phasor comprises determining a difference in phase angle between the first and the second DFT phasor. Put differently the frequency at the first time is determined in the following way:

An interpolation is performed to find the angle at the optimal time difference $1/(2f_{old})$, i.e. at the time interval that depends on the approximated frequency $f_{old}$. The following set of equations illustrates how this can be done:

From the approximated frequency, which is the last estimated frequency fold, the number of samples s corresponding to the optimal time step is calculated as $$s = \frac{1}{2t_s f_{old}} \quad (6)$$

Note that the step s will generally not be an integer. The DFT result at the preceding time before the current sample n at the current time, i.e. the second DFT phasor at the time interval before the first DFT phasor at the first time, can then be estimated by linear interpolation as $$DFT[n-s] \approx DFT[n-\text{Floor}(s)]+$$

$$+(s-\text{Floor}(s))(DFT[n-\text{Ceiling}(s)]-DFT[n-\text{Floor}(s)]) \qquad (7)$$

where Floor(s) and Ceiling(s) are the closest integers smaller respectively larger than s. The angle difference then gives the estimated frequency at the first time by $$f_{new} \approx \frac{1}{2\pi s t_s} \text{Phase}\left[\frac{DFT[n]}{DFT[n-s]}\right] \qquad (8)$$

where DFT(n) is the first DFT phasor at the first time and DFT [n-s] is the second DFT phasor at the time interval $1/(2f_{old})$, i.e. at the time interval that depends on the approximated frequency $f_{old}$.

Figure 6:
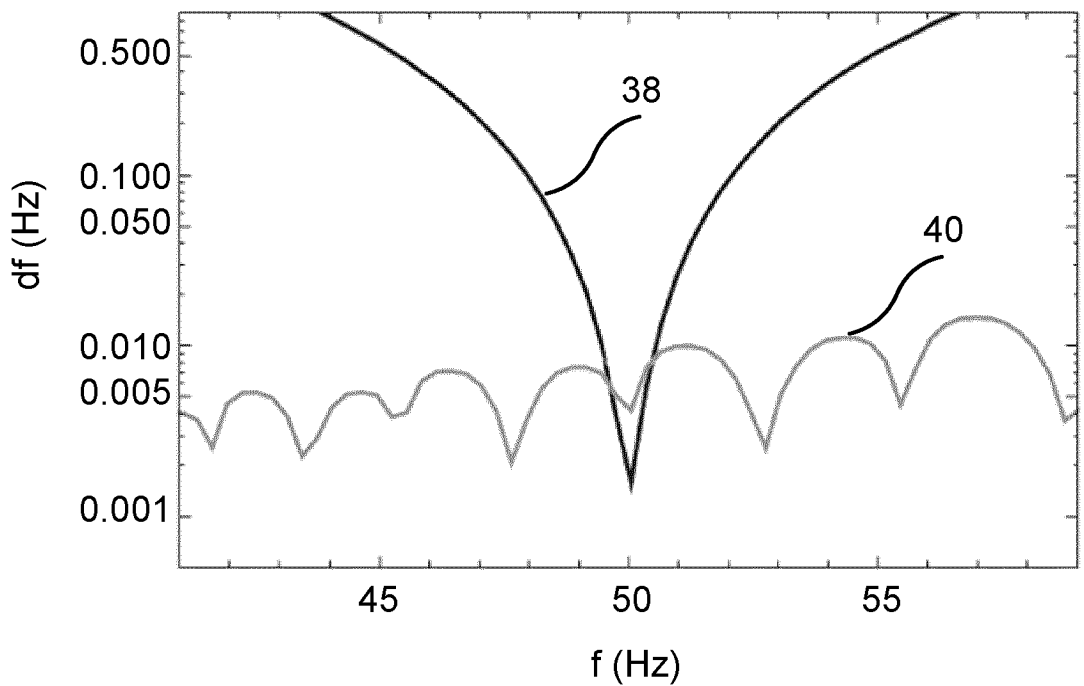
FIG. 6 shows a comparison of a conventional frequency estimation and the frequency estimation according to the method.

This approach is applicable in a wide frequency range. This can be seen in FIG. 6, which shows a frequency sweep from 40 to 60 Hz in 48 seconds of a traditional frequency estimation 38 using fixed steps and the frequency estimation using interpolation 40. As can be seen, the interpolation approach gives a more or less constant deviation of about 0.01 Hz in the frequency range of 40-60 Hz.

There are some possible variations in the frequency deviation of the described approach. A closer inspection reveals that the minima occurs for frequencies corresponding to integer number of samples, such as 47.62, 50 and 52.63 Hz. The deviation in the interpolated signal can thus be traced to the linear interpolation employed; higher order interpolations would reduce the deviation further.

Higher order interpolations such as polynomial interpolation or spline interpolation may be employed. Higher order interpolations require at least three DFT results.

The DFT result at the desired time before the current sample n at the current time, DFT[n-s], can be estimated using higher order interpolation using, for example, DFT results at current samples n-Floor(s), n-Floor(s)+x, n-Ceiling(s), n-Ceiling(s)-y, wherein x and y are integers. In other words, at least three DFT results at current samples preceding and following the desired time may be used to estimate the DFT result at the desired time by employing higher order polynomials.

Put differently, the second DFT phasor can be estimated by higher order interpolation using at least three DFT phasors. A DFT phasor of the at least three DFT phasors is obtained at a sampling time preceding the time at which the second DFT phasor is to be estimated, and another DFT phasor of the at least three DFT phasors is obtained at a sampling time following the time at which the second DFT phasor is to be estimated.

Using a higher number of DFT phasors may allow for increasing the order of interpolation, which would reduce the deviation further.

The determined frequency may then be considered to be a system frequency of the power system. It may more particularly be an estimation of the momentaneous system frequency associated with the first time.

The determined frequency may then be directly used by the protective activity performing module 20 for performing a fault handling measure. The protective activity performing module 20 may thus apply the system frequency estimation in a fault handling measure in the electrical power system, 36. This may involve a range of different activities such as protective activities in the field of rate of change of frequency (ROCOF) activities, such as disconnecting a load.

Figure 7:
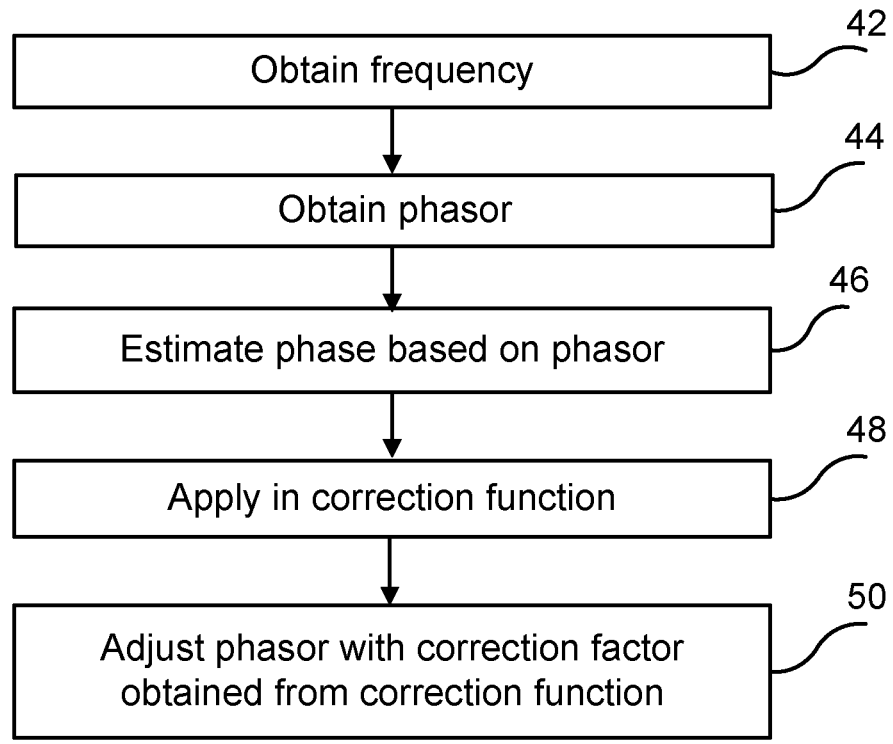
FIG. 7 shows a number of elements in a method for improving phasor accuracy of an electrical quantity in the electrical power system.

As was mentioned earlier, the frequency estimation may also be used in relation to the DFT phasors. It may more particularly be used for correcting the DFT phasors. How this may be done will now be discussed with reference being made to FIG. 7, which shows a number of elements in a method for improving phasor accuracy of an electrical quantity in the electrical power system.

Again, the DFT Phasor determining module 14 determines a phasor of an electrical quantity in the electrical power system, which phasor is provided to the frequency estimating module 16 as well as to the DFT phasor correcting module 18. The frequency estimating module 16 determines the frequency of the phasor and also provides this frequency to the DFT phasor correcting module 18.

The DFT phasor correcting module 18 thereby obtains the frequency of the electrical quantity, 42, as well as obtains the corresponding phasor, 44, where the frequency is the previously discussed frequency at the first time determined by the frequency estimating module 16 and the corresponding phasor is the previously discussed first DFT phasor at the first time used in the determining of this frequency. Optionally the DFT phasor correcting module 18 also estimates a phase based on the phasor, 46, and then applies the frequency and phase to a correction function, 48, where the correction function is based on an analytical expression for the phasor. The analytical expression may as an example the previously mentioned first analytical expression realized through equation 2. Finally, the DFT phasor correcting module 18 adjusts the phasor with a correction factor obtained from the correcting function, 50.

The correction function that is based on the analytical DFT phasor expression of the mathematical analysis tool may as an example be in the form of equation (2). This first expression has a phase angle parameter φ and a frequency parameter f and represents a DFT phasor. Thereby also the correction function has a frequency parameter f and a phase angle parameter cp.

The estimating of the phase may involve estimating an initial phase to be used in the correction function.

The estimating of the initial phase may be based on the analytical expression of the DFT phasor and a zero phase angle. The initial phase may more particularly be estimated based on a difference between the phase of the DFT phasor at the previously mentioned first time and a phase of the correction function with a phase angle parameter setting of zero. As an alternative, the initial phase may be estimated through applying a zero phase angle in an analytical expression that is a series expansion of the analytical expression of the DFT phasor around a nominal frequency of the power system.

After the initial phase has been estimated, the phase correction module then applies the initial phase as phase parameter together with the determined frequency at the first time as the frequency parameter in the phase correction function, where the correction function is based on the analytical DFT phasor expression, here exemplified by equation 2.

Through the application of the parameters in the correction function, the DFT phasor correcting module 18 obtains a correction factor and the DFT phasor correcting module 18 then adjusts the current DFT phasor with the correction factor obtained from the correction function, which correction factor was thus obtained by using the system frequency estimation as the frequency parameter and the estimated initial phase as the phase parameter.

This type of estimation may thereafter be iteratively performed for following DFT phasors, where the frequency is the corresponding estimated new frequency of a current phasor and the phase is the phase of the current phasor adjusted with the previous phase.

The adjusted phasor may additionally be provided to the protective activity performing module 20, which may in turn process the corrected phasors and perform a protective activity in case a processed current phasor indicates a fault.

The operation of the DFT phasor correcting module 18 may also be described in the following way.

The closed DFT expression for a sinusoidal with unity amplitude and fixed frequency i.e. eq. 2, can be used to correct the DFT result for any waveform w(t). The correction function, corr($f$, $\varphi$), can be derived by dividing eq. 2 with the result for $f=f_o$, eq. 4, resulting in:

$$\text{corr}(f, \varphi) = \frac{e^{-2j\left(-\frac{\pi}{N}+\varphi+\frac{f\pi}{f_0}\right)}\left(1 - e^{\frac{2jf\pi}{f_0}}\right)}{\left(e^{\frac{2j\pi(f+f_0)}{Nf_0}} - e^{\frac{4jf\pi}{Nf_0}} + e^{\frac{2j(f\pi+\varphi f_0)}{f_0}}\left(1 - e^{\frac{2j\pi(f+f_0)}{Nf_0}}\right)\right)}{\left(e^{\frac{2j\pi}{N}} - e^{\frac{2jf\pi}{Nf_0}}\right)\left(1 - e^{\frac{2j\pi(f+f_0)}{Nf_0}}\right)N} \quad (9)$$

Then the corrected, or accuracy enhanced, DFT results is $$DFT_{enh}(w(t)) = \frac{DFT(w(t))}{\text{corr}(f(t), \varphi(t))} \quad (10)$$

The correction function is stated to be dependent on the signal actual frequency f and its phase $\varphi$ only, as the other two parameters, $f_o$ and N, are supposedly kept constant in every specific application.

Figure 8:
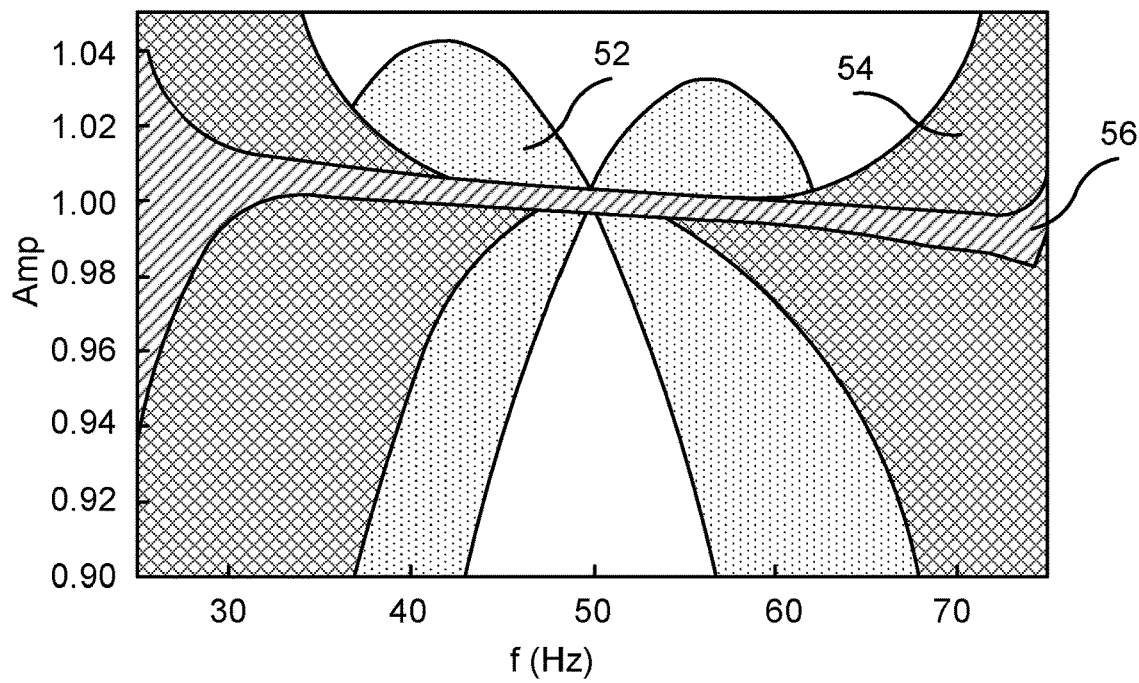
FIG. 8 shows a standard DFT amplitude, a corrected DFT amplitude with linearized start angle and a corrected DFT amplitude after four iterations in a frequency range around a nominal frequency.

If the phase can be estimated, the correction is straightforward and can eliminate the frequency artefact to numerical precision. This can be seen in FIG. 8, which shows DFT amplitudes for a frequency sweep between 25 and 75 Hz in three variants: a standard DFT 52, a corrected DFT with linearized start angle without averaging 54 and a corrected DFT after 4 iterations 56.

Figure 9:
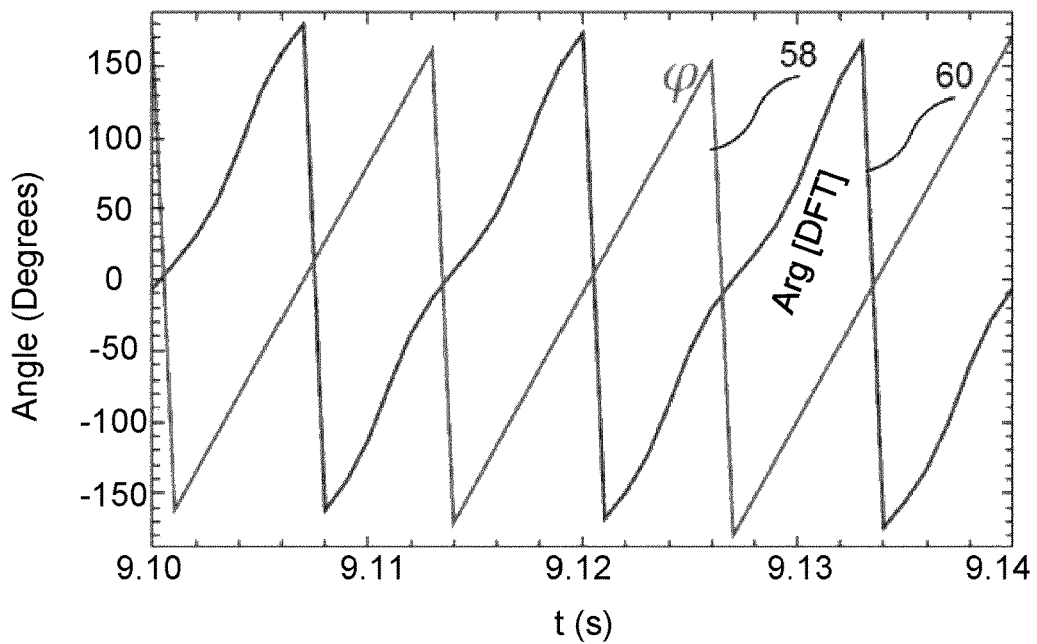
FIG. 9 shows a relationship between a starting angle of a correction function and an angle of a corresponding DFT phasor, and FIG. 10 schematically shows a data carrier with computer program code, in the form of a CD-ROM disc, for implementing the frequency estimating module, the protective activity performing module and the DFT Phasor correcting module.

The start angle poses a slightly more intricate problem than the frequency but can also be estimated from the standard DFT result. A complication is that the DFT phasor angle is not equal to the required start angle $\varphi$ even though they must be related as they both increase with the same slope (on average) to reflect the actual frequency. FIG. 9 exemplifies this statement, which shows a relation between the start angle $\varphi$58 and the angle 60 of the DFT phasor for a 75 Hz signal DFT analyzed for 50 Hz.

If the slope is considered known, the relation between $\varphi$ and Phase[DFT] is approximately found as a straight line though a point given by DFT($\varphi$=0). Thus, the start angle can be approximated by $$\tilde{\varphi} = \text{Phase}[DFT] - \text{Phase}[\text{corr}(f, 0)] + \frac{\pi}{2} \quad (11)$$

where $\pi/2$ comes from the phase difference between the correction function corr($f$, $\varphi$) and the DFT expression, eq. 2. It can thereby be seen that the initial phase is estimated based on the first equation and a zero phase angle, where additionally the initial phase is estimated based on a difference between the phase of the current DFT phasor and a phase of the correction function with a phase angle parameter setting of zero.

This approach does however require that the expression for corr($f$, $\varphi$), eq. 9, is executed twice for each corrected sample which increases the computational cost considerably. This calculation can be approximated by a simpler expression given by the series expansion of the DFT expression, eq. 4, with $\varphi=0$ around $f=f_o$:

$$DFT[\sin(2\pi ft)] = -j + \frac{\pi\left(N - 2 + j\text{Cot}\left[\frac{2\pi}{N}\right]\right)(f - f_0)}{f_0 N} + O[f - f_0]^2 \quad (12)$$

This equation contains the trigonometrical function Cot [$2\pi/N$] but this is the same in all evaluations and can thus be calculated once and for all. The angle of the first two terms of eq. 12 can thus be used to correct the DFT angle, similar to eq. 11. It can thereby be seen that the initial phase is estimated based on the first analytical expression and a zero phase angle, where in this case the initial phase is estimated through applying a zero phase angle in an analytical expression of the analytics tool (equation 12) that is a series expansion of the first analytical expression around a nominal frequency $f_0$ of the power system.

Both the above described approaches of estimating the initial phase angle are equally well suited in a 10% range around $f_o$.

Adding an angle correction factor does not affect the oscillation in the DFT phase and will serve to degrade the correction accuracy. To diminish the oscillations, a floating average approach can be employed for both the frequency estimate and the start angle, albeit with additional complications. The complications arise from the facts that the angle is steadily increasing and, worse, regularly jumps from 180° to −180°. To use an averaging approach, these complications must be eliminated.

The complications can be eliminated through first removing the linear phase increase, then performing the averaging and finally adding back the linearly increasing angle.

An averaging interval of one period may be optimal to minimize delay.

The quality of the frequency and start angle estimates limit the possible accuracy enhancement. Investigations indicate that the start angle estimate is more decisive for an acceptable result than the frequency. To overcome this limitation, an iterative procedure can be envisioned where the frequency and start angle estimates are taken from the last corrected DFT phasor as these estimates should have reduced oscillations.

A quite large range of frequencies can thus be accuracy enhanced, if enough computational effort is invested. Here it appears that the region 30-70 Hz can be covered with 4 iterations if 1% accuracy is required. This can be compared to the region in which the standard DFT is within the same accuracy: approximately 49.5-50.5 Hz.

Thus, for protection, the envisaged optimal implementation is to use DFT accuracy enhancement without iteration. Frequency estimates and start angles can be obtained in the ways described above, where the linearized formula, eq. 12, could be preferred. Linear interpolation for the frequency estimate should give little additional computational cost while start angle averaging may add a noticeable burden. With such an implementation, it is expected that most modern protection relays will be able to accommodate the DFT enhancement at least for some critical signals.

For off-line applications, computational burden is not a main concern but of course it should not be wasteful. Thus, one can envisage an adaptive implementation that selects more heavy computations the more the estimated frequency deviates from nominal. Such a ladder of increased computational effort could constitute:

1. The same implementation as for protection when the frequency is close to nominal. A tentative range is ±2 Hz.
2. Increased number of iterations as the frequency deviates more and more from nominal.

As mentioned earlier, the estimated frequency and the corrected phasor can be used in a number of areas.

The fault handling function may be any of a number of fault handling functions. As an example, the fault handling measure may be a Rate of Change of Frequency (ROCOF) protection measure.

As another example the fault handling measure may be an ensuring of reliability of phasor estimates under severe system contingencies when the frequency deviates considerably from nominal. One possible application is thus to deliver phasors with reliable precision and good time resolution during system contingencies. A common system contingency is loss of a generating facility which will lead to a frequency decrease until controls have acted to restore the system if at all possible. Many total system collapses that have occurred originate on such events where additional unfortunate events or conditions have led to the collapse. Sadly enough, it appears that malfunctioning protection is not uncommon among these unfortunate events. Thus, there may be hope that the enhanced DFT may reduce the risk for cascading events leading to a system collapse.

This example thus shows that an enhancement procedure can give more accurate phasor estimates during system contingencies when the frequency is dropping.

Another example where the improved frequency estimations and/or DFT phasor corrections may be of interest is when a generator suddenly loses a load.

An unexpected method to obtain a substantially enhanced accuracy of DFT phasor estimates has been presented in detail. It can reduce the well-known DFT frequency dependent artefact down to the system noise level and the artefact is thus invisible. This is possible in a wide frequency range of more than ±10 Hz. Several variants of enhanced DFT are presented with increased frequency range and accuracy at the cost of more computational effort. It is estimated that at least the most basic version, having better than 1% accuracy in a ±5 Hz interval should be possible to run on most of the present real time protection and control platforms.

In addition to enhanced phasor accuracy, a simple algorithm for frequency estimation has been proposed. This algorithm has less than one period delay and is applicable with good accuracy in a wide frequency interval.

It is envisaged that the enhanced accuracy of the frequency estimation and DFT phasors will contribute to more reliable control and protection of the power system as the DFT algorithm is extensively used in these applications. The enhanced accuracy enables development of other applications in the future.

Figure 10:
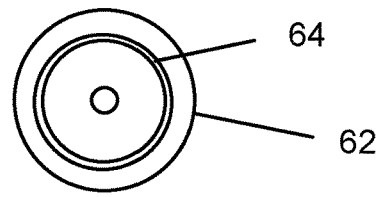

The frequency estimating module and the protective activity performing module as well as the optional DFT Phasor correcting module and DFT phasor determining module may, as was discussed earlier, be implemented using software. They may thus be implemented using computer program code, which may be provided on one or more data carriers which performs the functionality of these modules when the program code thereon is operated upon by one or more processor or being loaded into one or more computers. One such data carrier 62 with computer program code 64, in the form of a CD ROM disc, is schematically shown in FIG. 10. Such computer program may as an alternative be provided on a memory stick. As an alternative the computer program may be provided on a server and downloaded therefrom into the one or more computer.

In a general or alternative aspect, the present disclosure relates also to a method for providing a frequency of an electrical quantity in an electrical power system (10), the method comprising:

obtaining (30), with respect to a first time, a first discrete Fourier transform, DFT, phasor of an electrical quantity in the electrical power system, estimating (32) a second DFT phasor at a first time interval before the first time, said first time interval depending on an approximated frequency, and determining (34) the frequency ($f_{new}$) at the first time based on the first and the second DFT phasor.

The approximated frequency may be a frequency at a second time preceding to the first time, in particular the frequency at the second time is determined based on a previous DFT phasor at the second time and a previous estimated DFT phasor at a second time interval before the second time.

Further, the first time interval may be given by one divided by a product, where the product is two times the approximated frequency.

Further, determining (34) the frequency at the first time based on the first and the second DFT phasor may comprise determining a difference in phase angle between the first and the second DFT phasor.

Further, the method may further comprise applying (36) the determined frequency at the first time in a fault handling measure in the electrical power system.

According to a further aspect, a method is provided for improving phasor accuracy of an electrical quantity in an electrical power system, the method comprising:

obtaining (42) a frequency of the electrical quantity, in particular according to the method of the general or alternative aspect mentioned above for providing a frequency of an electrical quantity in an electrical power system;

obtaining (44) a phasor of the electrical quantity, in particular the first DFT phasor mentioned above;

applying (48) the frequency to a correction function, which correction function is based on an analytical expression for the phasor; and adjusting (50) the phasor with a correction factor obtained from the correction function.

According to an embodiment, the analytical expression may be based on a sinusoidal function.

Further, the correction function may comprise a phase of the phasor as a parameter and the method further comprises estimating (48) the phase for the correction function based on the phasor.

Further, the method may further comprise estimating an initial phase to be used in the correction function based on the analytical expression and a zero phase angle.

Further, the method may further comprise applying the adjusted phasor in a fault handling measure in the electrical power system. In particular, the fault handling measure may be a Rate of Change of Frequency (ROCOF) protection measure.

Further, the fault may comprise short circuit faults and/or the protection may be the protection of a generator.

According to a further aspect, a phasor processing device (12) for use in an electrical power system (10) is provided. The phasor processing device may comprise a processor (22) configured to:
- obtain, with respect to a first time, a first discrete Fourier transform, DFT, phasor of an electrical quantity in the electrical power system,
- estimate a second DFT phasor at a first time interval before the first time, said first time interval depending on an approximated frequency, and
- determine the frequency ($f_{new}$) at the first time based on the first and the second DFT phasor.

According to one embodiment, the device may be selected from the group of: an intelligent electronic device, a protection relay, a phasor measurement unit, a grid controller and a merging unit.

According to yet a further aspect, a computer program product for providing a frequency of an electrical quantity in an electrical power system (10) is provided. The computer program product may be provided on a data carrier (62) comprising computer program code (64) configured to cause a processor to, when said computer program code is being operated upon by the processor (22)
- obtain, with respect to a first time, a first discrete Fourier transform, DFT, phasor of an electrical quantity in the electrical power system,
- estimate a second DFT phasor at a first time interval before the first time, said first time interval depending on an approximated frequency, and
- determine the frequency ($f_{new}$) at the first time based on the first and the second DFT phasor.

From the foregoing discussion it is evident that the present invention can be varied in a multitude of ways. It shall consequently be realized that the present invention is only to be limited by the following claims.

The invention claimed is:

1. A method for providing a frequency of an electrical quantity in an electrical power system, the method comprising:
- obtaining, with respect to a first time at which the electrical quantity is sampled, a first discrete Fourier transform (DFT) phasor of the electrical quantity in the electrical power system,
- estimating a second DFT phasor at a first time interval before the first time, said first time interval depending on an approximated frequency, wherein the second DFT phasor is estimated by interpolation using DFT phasors obtained at sampling times around the time at which the second DFT phasor is to be estimated,
- determining the frequency (fnew) at the first time based on the first and the second DFT phasor, and
- control the electrical power system based on the determined frequency, wherein the control comprises one or more of controlling a circuit breaker, disconnecting a load, or restoring a frequency of the electrical power system.

2. The method according to claim 1, wherein the second DFT phasor is estimated by linear interpolation using a DFT phasor obtained at a sampling time directly preceding the time at which the second DFT phasor is to be estimated and another DFT phasor obtained at a sampling time directly following the time at which the second DFT phasor is to be estimated.

3. The method according to claim 1, wherein the second DFT phasor is estimated by higher order interpolation using at least three DFT phasors obtained at sampling times around the time at which the second DFT phasor is to be estimated.

4. The method according to claim 1, wherein the approximated frequency is a frequency at a second time preceding the first time, in particular the frequency at the second time is determined based on a previous DFT phasor at the second time and a previous estimated DFT phasor at a second time interval before the second time.

5. The method according to claim 1, wherein the first time interval is given by one divided by a product, where the product is two times the approximated frequency.

6. The method according to claim 1, wherein determining the frequency at the first time based on the first and the second DFT phasor comprises determining a difference in phase angle between the first and the second DFT phasor.

7. The method according to claim 1, further comprising applying the determined frequency at the first time in a fault handling measure in the electrical power system.

8. The method according to claim 1, further comprising:
- applying the determined frequency to a correction function, which correction function is based on an analytical expression for the phasor; and
- adjusting the phasor with a correction factor obtained from the correction function.

9. The method according to claim 8, wherein the analytical expression is based on a sinusoidal function.

10. The method according to claim 8, wherein the correction function comprises a phase of the phasor as a parameter and the method further comprises estimating the phase for the correction function based on the phasor.

11. The method according to claim 10, further comprising estimating an initial phase to be used in the correction function based on the analytical expression and a zero phase angle.

12. The method according to claim 8, further comprising applying the adjusted phasor in a fault handling measure in the electrical power system.

13. The method according to claim 12, wherein the fault handling measure is a Rate of Change of Frequency (ROCOF) protection measure.

14. The method according to claim 12, wherein the fault comprises short circuit faults and/or the protection is the protection of a generator.

15. A phasor processing device for use in an electrical power system, the phasor processing device comprising a processor configured to:
- obtain, with respect to a first time at which an electrical quantity is sampled, a first discrete Fourier transform (DFT) phasor of the electrical quantity in the electrical power system,
- estimate a second DFT phasor at a first time interval before the first time, said first time interval depending on an approximated frequency, wherein the second DFT phasor is estimated by interpolation using DFT phasors obtained at sampling times around the time at which the second DFT phasor is to be estimated, and
- determine the frequency (fnew) at the first time based on the first and the second DFT phasor, and
- control the electrical power system based on the determined frequency, wherein the control comprises one or more of controlling a circuit breaker, disconnecting a load, or restoring a frequency of the electrical power system.

16. The phasor processing device according to claim 15, wherein the second DFT phasor is estimated by linear interpolation using a DFT phasor obtained at a sampling time directly preceding the time at which the second DFT phasor is to be estimated and another DFT phasor obtained at a sampling time directly following the time at which the second DFT phasor is to be estimated.

17. The phasor processing device according to claim 15, wherein the second DFT phasor is estimated by higher order interpolation using at least three DFT phasors obtained at sampling times around the time at which the second DFT phasor is to be estimated.

18. The phasor processing device according to claim 15, wherein the device is selected from the group of: an intelligent electronic device, a protection relay, a phasor measurement unit, a grid controller, and a merging unit.

19. A non-transitory computer-readable medium storing computer program code for providing a frequency of an electrical quantity in an electrical power system, said computer program code configured to cause a processor to, when said computer program code is being operated upon by the processor:
 obtain, with respect to a first time at which the electrical quantity is sampled, a first discrete Fourier transform (DFT) phasor of the electrical quantity in the electrical power system,
 estimate a second DFT phasor at a first time interval before the first time, said first time interval depending on an approximated frequency, wherein the second DFT phasor is estimated by interpolation using DFT phasors obtained at sampling times around the time at which the second DFT phasor is to be estimated, and
 determine the frequency (fnew) at the first time based on the first and the second DFT phasor, and
 control the electrical power system based on the determined frequency, wherein the control comprises one or more of controlling a circuit breaker, disconnecting a load, or restoring a frequency of the electrical power system.

20. The non-transitory computer-readable medium according to claim 19,
 wherein the second DFT phasor is estimated by linear interpolation using a DFT phasor obtained at a sampling time directly preceding the time at which the second DFT phasor is to be estimated and another DFT phasor obtained at a sampling time directly following the time at which the second DFT phasor is to be estimated, or
 wherein the second DFT phasor is estimated by higher order interpolation using at least three DFT phasors obtained at sampling times around the time at which the second DFT phasor is to be estimated.

* * * * *